Jan. 27, 1959

H. T. FRIIS ET AL 2,871,353

ELECTROMAGNETIC WAVE DETECTOR

Filed Sept. 2, 1954

INVENTORS: H. T. FRIIS
W. M. SHARPLESS

BY Roy M. Porter, Jr.

ATTORNEY 2,871,353

ELECTROMAGNETIC WAVE DETECTOR

Harald T. Friis, Rumson, and William M. Sharpless, Fair Haven, N. J., assignors to Bell Telephone Laboratories, Incorporated, New York, N. Y., a corporation of New York Application September 2, 1954, Serial No. 453,778

7 Claims. (Cl. 250—31)

This invention relates to electromagnetic wave devices and more particularly to asymmetrically conducting crystal type detectors for converters, mixers, or modulators of electromagnetic wave energy at very short wavelengths.

Many characteristics of the crystal type asymmetrically conducting device have made its use very desirable in the high frequency ranges of electromagnetic wave energy. In Patents 2,436,830, granted March 2, 1948, and 2,438,521, granted March 30, 1948, to applicant Sharpless, there are disclosed various techniques for efficiently and effectively utilizing this type of rectifier in the centimeter wave and microwave ranges.

In these ranges, the most suitable form of crystal arrangement has proven to be a crystal encased in a removable coaxial cartridge located in the path of the wave energy along with the necessary reactive elements, such as tuning screws, to accomplish impedance matching. As the frequency range has been extended into the millimeter wave range, the coaxial cartridge arrangements have not proven satisfactory. The high loss and distributed capacity caused by the encasing materials of the cartridge arrangement, the band narrowing effects of the tuning screws and their increased loss and instability have proved substantially limiting factors.

An alternative is afforded by a fixed mounting of the crystal element directly in the wave guide. Since the fixed mounting precludes any possibility of latter adjustment, the initial handling and assembling operations are difficult and the manufacture of the device is costly. Furthermore, the susceptibility of the crystal to damage by mechanical shock creates a considerable problem in the mounting of the crystal so that when in place it will be firmly held with good electrically reproducible contacts and still be susceptible of being removed so that it may be replaced in case of failure.

It is therefore, a first object of the present invention to provide a mounting for an asymmetrically conducting device of the crystal rectifier type in millimeter wavelength electromagnetic wave equipment that permits the ready removal and replacement of the device.

It is a second object of the invention to match the impedance of the crystal rectifier to the impedance of a connected wave guide system without the need of reactive tuning screws.

The first object is accomplished in the embodiment to be described by mounting the asymmetrically conducting assembly including the crystal and its contactors across an aperture in a thin, slab-like member of conductive material. This member constitutes a rigid support by which the crystal and its contactors are firmly held. When received transversely across an input wave guide channel in the manner to be described, the aperture in effect constitutes a continuation of the channel. Thus, the electrical advantages of a directly mounted crystal assembly are obtained and at the same time the crystal in its support is easily removed for replacement.

The second object is accomplished by so arranging the support member that the position of the crystal may be adjusted transversely across the cross section of the input wave guide channel. This will accomplish a match of the resistive component of the crystal impedance to the wave guide channel while the reactive component is tuned out by an adjustable septum or plunger located on the other side of the supporting member from the input wave guide channel.

These and other objects, the nature of the present invention, its various advantages, and its features will appear more fully upon consideration of the various specific illustrative embodiments shown in the accompanying drawings and described in the following detailed description.

Figure 1:
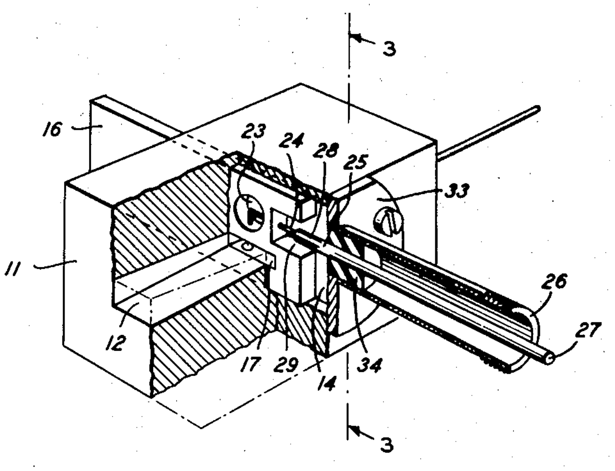
Fig. 1 is a cut-away perspective view of a detector, converter or mixer unit showing the wave guide assembly and also the crystal unit which the assembly is adapted to receive.
Figure 3:
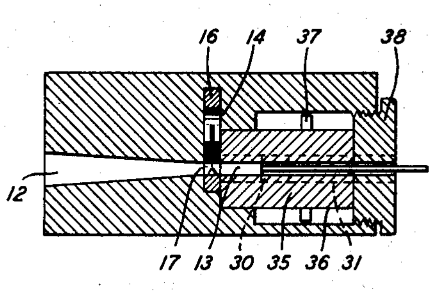
Fig. 3 is a cross-sectional view taken through Fig. 1 as indicated.

Referring more specifically to the illustrative embodiment of the invention shown in Fig. 1, it will be seen that the wave guide assembly portion is formed from a block 11 of conductive material such as brass, copper or steel which is cast or machined with a transversely extending slot 14 that intersects at right angles a longitudinal opening 12 extending through substantially the center of block 11 to the left of slot 14. Block 11 also has a longitudinal cylindrical opening 36, axially aligned with opening 12, extending to the right of slot 14. Opening 36 is seen only in the cross-sectional view of Fig. 1 which is shown as Fig. 3. A bushing 35, guided by keyway combination 37, is received within opening 36. Bushing 35 has an axial opening 13 of rectangular cross section extending through its length. A thumb screw 38, threaded into block 11, bears against the right hand end of bushing 35 and when completely tightened forces bushing 35 to the left to extend slightly into slot 14 for the purposes to be described.

Openings 12 and 13 constitute wave guiding channels of rectangular cross section that have equal and constant wide dimensions of at least one-half wavelength of the fundamental frequency of the input signal wave to be conducted thereby. The narrow dimensions of channels 12 and 13 are in the order of one-half of the wide dimension thereof but for the purposes to be described hereinafter in the embodiment illustrated, the narow dimension of channel 12 is maximum at its left hand end and tapers to a minimum dimension in the cross section where it intersects slot 14. The narrow dimension of channel 13 is substantially constant and equal to the minimum dimension of channel 12.

To facilitate manufacture it has been found desirable to assemble block 11 from several separately machined and suitably fastened together parts rather than to form it integrally as illustrated in the drawing. While separate wave guides may be used for channels 12 and 13 it is convenient to retain the block-like shape for the assembled combination so that the wall thickness of channels 12 and 13 is comparable to the cross section of the channel. Other considerations that make the general form of the invention as illustrated desirable will become apparent hereinafter.

Figure 2:
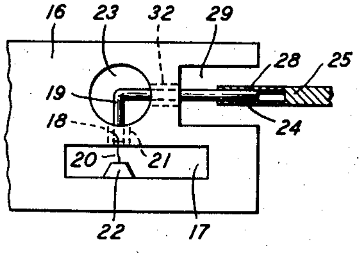
Fig. 2 is a detailed view of the crystal unit including the rigid support member which contains the asymmetrically conductive assembly of the crystal and its contactors.

The rigid support member and the included asymmetrically conducting assembly is shown in detail in Fig. 2 and is also shown inserted in slot 14 of block 11 in Fig. 1. Referring to Fig 1, and for detail to Fig. 2, this support comprises a very thin slab-like member 16 of conductive material that has a width and thickness only slightly less than the wide and narrow dimensions, respectively, of slot 14 so that member 16 may be received snugly within slot 14 and yet be free for transverse movement therein. Member 16 may be locked in a given position by tightening screw 38 which forces bushing 35 against member 16 which in turn forces member 16 against the opening of channel 12. The length of member 16 is chosen so that when it is fully inserted into slot 14 a small portion of member 16 will protrude from block 11 as a grip or handle to withdraw member 16. Member 16 is provided with a rectangular aperture 17 extending through its thickness. The wide dimension of aperture 17 is substantially larger than the wide dimension of channel 12 and the narrow dimension thereof is substantially equal to the intersected narrow dimension of channel 12 and to the narrow dimension of channel 13. Aperture 17 is positioned and located in member 16 so that when member 16 is inserted within slot 14 the wider walls of aperture 17 are aligned with the wider walls of channels 12 and 13. Thus aperture 17, in effect, constitutes a connecting wave guide channel of less than one-half wavelength in length, between the separated contiguous ends of channels 12 and 13. The portions of channel 17 that extend on either side beyond the narrow walls of channels 12 and 13 form cavities which depend for their relative depths upon how far member 16 is inserted into slot 14. These cavities always appear beyond cutoff because of the short length of channel 17 and will therefore present a very small discontinuity in the narrow walls of channels 12 and 13.

The asymmetrically conducting assembly is disposed in channel 17 to extend transversely across the narrow dimension thereof. This asymmetrical assembly comprises a conductive rod 19 that extends through the body of member 16 and protrudes through a cut-away portion in the top wide wall of channel 17. On the end of rod 19 is seated and suitably fastened an asymmetrically conducting crystal 18 of known type. Crystal 18 can be a small wafer-like piece of semiconductive material, such as silicon doped with a small percentage of boron. Rod 19 is insulated from the body of member 16 by a sleeve of insulating or ceramic material 21, which insulating section can in addition comprise a high frequency bypass condenser by suitably choosing the capacity that results between rod 19 and the body of member 16. Rod 19 is bent so that its end portion 24 is brought out from within member 16 through a second sleeve 32 of insulating material, parallel to the direction of possible movement of member 16 in slot 14 with the particular advantage to be described hereinafter. An aperture 23 may be provided in member 16 at the point of bending to facilitate the location and positioning of rod 19 and to control the capacity between rod 19 and member 16.

Crystal 18 is engaged on its exposed surface by conducting point member or cat whisker 20 extending perpendicular to the wide walls of channel 17. In order that the inductance of whisker 20 be low, it is made very short, the remainder of the connection to the lower wall of channel 17 being made by an enlarged, tapered, low inductance post 22 of conductive material.

It is thus apparent that the crystal unit may be assembled outside of its associated wave guide assembly by mounting crystal 18, rod 19 and whisker 20 within the channel 17. Free and unencumbered access is afforded to each of these parts. The complete converter is assembled by inserting member 16 within slot 14 and locking it in place by screw 38. The crystal output is taken by way of the direct current electrical connection to crystal 18 through a coaxial conductor 26, the outside shield of which is grounded to the body of block 11 by connector 33 and thereby connected through post 22 and whisker 20 to crystal 18. The path from the other surface of crystal 18 is completed through rod 19. It should be noted that the polarity of the crystal 18 may be reversed relative to the wave guide circuits by grounding crystal 18 and connecting post 22 to rod 19. The end 24 of rod 19, which is brought out parallel to the direction of movement, extends within a tube-like ending 25 of the inner conductor 27 of coaxial conductor 26. Spring-like fingers 28 provide a gripping jaw for ending 25 to maintain a good electrical contact between conductor 27 and conductor 24 regardless of the position of member 16. A notch 29 may be provided in the end of member 16 and a suitable pass-through insulator 34 in the wall of block 11 to provide clearance and support for fingers 28 of ending 25.

Removal and replacement of the crystal unit are simply performed by loosening screw 38, withdrawing support member 16 and replacing it by a similar member containing a new crystal. And yet, while being easily replaceable, the crystal mounting itself enjoys many of the advantages of being permanently mounted. Member 16 provides a rigid support to protect crystal 18 from damage by mechanical shock. Since the asymmetrically conducting assembly including crystal 18 and its contactors 19, 20 and 22 need not be handled separately in replacement, the necessary small size of these parts is no problem. There is no cartridge shield, metallic or otherwise, to affect the capacity of the crystal circuit. Furthermore, the mounting is such that when in place crystal 18 is held firmly with good electrical reproducible contacts and still is susceptible of being removed so that it may be replaced in case of failure. All high frequency paths, including the bypass condenser, are included within the support.

The fixed mounting of the asymmetrically conducting assembly precludes any possibility of its adjustment after assembly. However, a particular feature of the present invention resides in the provision made for matching the impedance of the crystal to the connected wave guide system without the use of tuning screws or other such devices that produce narrowed bandwidths, instability and losses. In accordance with the invention, the match is made by separately matching the resistive component and the inductive component of the impedance match.

In this connection it should be recalled that the resistive component of the impedance of a rectangular wave guide varies across the wide dimension thereof from zero adjacent to the narrow walls and increases to a value equal to the characteristic impedance of the guide at the center line of the wide wall. In accordance with the present invention, the resistive component of the impedance of crystal 18 is matched to the resistive component of channel 12 by adjusting the position of crystal 18 in the cross section of channel 12 by inserting and withdrawing member 16 in slot 14.

It is necessary that the position of crystal 18 should fall somewhere between the center line of channel 12 and one of its narrow walls for the optimum match. This may be done by assuring that the impedance of crystal 18 and its contacting elements 20 and 22 is less than the characteristic impedance of channel 12 at the cross section where it adjoins channel 17. It may be desirable to employ more or less standardized components for the assembly of crystal 18, which components have been made to predetermined specifications, or to use components which even though made as small as possible from a mechanical standpoint, still, at the very short wavelengths contemplated, may have minimum impedances that approximately equal or even exceed the characteristic impedance of wave guides of conventional sizes at these wavelengths. For this purpose channel 12 is provided with a taper which decreases from a maximum narrow dimension at its left hand end which has an impedance that is equal to that of the connected wave guide system, to a minimum dimension at its right hand end which has a characteristic impedance that exceeds the impedance of the assembly of crystal 18 and is selected relative to the approximate impedance of the assembly so that the resistive match is obtained at the desired location off the center line of channel 12.

Having thus matched the resistive component of the impedance of the assembly of crystal 18 to channel 12, the reactive component of the impedance match is tuned out in channel 13 by terminating it by means of an adjustable septum 30 extending into the right hand end and parallel to the narrow walls of channel 13. Septum 30 is arranged to make good contact with the wider walls of channel 13. For this purpose the septum is formed by two curved strips of resilient material mounted back to back with their edges riding in milled grooves 31 in the wide walls of channel 13. The effect of septum 30 is to divide channel 13 into two sections of such dimensions that each section is beyond cutoff at the highest frequency of operation contemplated. Septum 30 therefore acts to terminate channel 13 in much the same way as if the guide were terminated by a short circuiting piston at a point near the inner edge of the septum.

In operation, the wave guide system, for example of a receiver, is connected to channel 12 by means of a conventional flange bolted to the face of block 11. Through this connection the signal and beating oscillations are introduced into the converter. The modulation products are taken out by way of coaxial conductor 26. When a crystal mounting of the type described is employed as a first detector, in which it is desirable to obtain an optimum signal to noise ratio, the present invention has special advantages. As is known, the magnitude of the beating oscillator drive in such a detector affects both the high frequency impedance and the noise figure of the crystal. By means of the impedance matching feature of the present invention it is possible to independently select the oscillator magnitude for optimum signal-to-noise ratio and then complete the impedance match by transverse movement of the crystal and adjustment of the septum as has been described.

It should be noted that the principles of the invention may also be applied to the mounting and impedance matching problems of other non-linear devices, such as thermistors and varistors, as well as to asymmetrically conducting devices as specifically described.

In all cases, it is understood that the above described arrangement is simply illustrative of one of many possible specific embodiments which can represent applications of the principles of the invention. Numerous and varied other arrangements can readily be devised in accordance with these principles by those skilled in the art without departing from the spirit and scope of the invention.

What is claimed is:

1. A mounting assembly for wave guide circuit components for electromagnetic wave energy of short wavelength, comprising a conductively bounded wave guiding channel for said energy having given cross-sectional dimensions, a thin slab-like member of conductive material received across said channel in a transverse plane of said channel, said member having an aperture extending through its thickness of cross-sectional dimensions at least as large as said given cross-sectional dimensions, one of said cross-sectional dimensions of said aperture being larger than the other of said cross-sectional dimensions of said aperture, said member being capable of transverse movement with respect to said channel parallel to the larger cross-sectional dimension of said aperture, and a wave guide circuit component extending across said aperture in a direction parallel to the smaller cross-sectional dimension of said aperture.

2. The combination of claim 1 wherein said wave guide circuit component comprises an asymmetrically conducting crystal element supported within said aperture and a point contacting member extending within said aperture to contact an exposed surface of said crystal.

3. An asymmetrically conducting crystal assembly for electromagnetic wave energy of short wavelength, comprising a hollow rectangular wave guide having narrow and wide conductive walls, a thin member of conductive material having a rectangular aperture extending through its thickness, said aperture having a narrow dimension substantially equal to the dimension of said narrow walls, said walls being slotted to receive said member transversely across said guide and free for movement parallel to said wide walls, a crystal element supported within said aperture, and conductive contact members extending into said aperture parallel to said narrow walls to contact opposite surfaces of said crystal.

4. An asymmetrically conducting crystal assembly for electromagnetic wave energy of short wavelength, comprising a conductively bounded wave guiding channel for said energy, a thin slab-like member of conductive material having an aperture extending through its thickness, the conductive boundary of said channel being slotted to receive said member for transverse movement across the cross section of said channel, a crystal element supported within said aperture, a conductive rod having one end thereof in contact with a surface of said crystal and being bent with a portion at the other end thereof extending parallel to the direction of said movement, and a tube-like conductor being coaxial with said other end portion to receive and make electrical contact with said portion at a plurality of transverse positions of said movable member.

5. An asymmetrically conducting crystal assembly for electromagnetic wave energy of short wavelength, comprising a pair of longitudinally aligned conductively bounded wave guiding channels of substantially rectangular cross section, the width of the wider walls of said channels being substantially greater than one-half of said wavelength, said channels having their contiguous ends spaced apart by a distance substantially less than one-half of said wavelength, another conductively bounded rectangular wave guiding channel having a wider internal wall of width substantially greater than said first mentioned width and a longitudinal length substantially less than one-half of said wavelength, said other channel being longitudinally received between said contiguous ends in a position adjustable in a transverse direction with the wider walls thereof aligned with the wider walls of said pair, an asymmetrically conducting crystal element supported within said other channel, and a point contacting member extending perpendicular to said wider walls to contact an exposed surface of said crystal.

6. The combination of claim 5 including a reflecting termination in one of said pair of channels with the other of said pair of channels being connected to a source of electromagnetic wave energy of short wavelength.

7. An asymmetrically conducting crystal assembly for electromagnetic wave energy of short wavelength, comprising a conductively bounded rectangular wave guiding channel for said energy having narrow and wide cross-sectional dimensions, an asymmetrically conducting element of the crystal type, means for supporting said element in said channel for transverse movement across the wide dimension of said cross section, a conductive rod having an end thereof in contact with a surface of said crystal, said rod being bent with the portion of said rod contiguous with said end extending parallel to the narrow dimension of said cross section and with the remaining portion extending parallel to the direction of said movement, and a tube-like conductor being coaxial with said remaining portion to receive and make electrical contact with said portion.

References Cited in the file of this patent

UNITED STATES PATENTS 2,685,028 Ditchfield ---------------- July 27, 1954

OTHER REFERENCES

Southworth: "Principles and Applications of Waveguide Transmission," pp. 282–283.